United States Patent
Huang et al.

(10) Patent No.: US 8,704,078 B2
(45) Date of Patent: *Apr. 22, 2014

(54) INTEGRATED SOLAR CELL AND BATTERY DEVICE INCLUDING CONDUCTIVE ELECTRICAL AND THERMAL PATHS

(75) Inventors: James P. Huang, Huntington Beach, CA (US); Russell M. Abbott, Riverside, CA (US); Namsoo P. Kim, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 2136 days.

This patent is subject to a terminal disclaimer.

(21) Appl. No.: 11/445,871

(22) Filed: Jun. 2, 2006

(65) Prior Publication Data
US 2007/0277876 A1    Dec. 6, 2007

(51) Int. Cl.
*H01L 31/042*    (2006.01)
(52) U.S. Cl.
USPC ............................ 136/244; 136/246; 136/256
(58) Field of Classification Search
USPC ............................................... 136/243–293
See application file for complete search history.

(56) References Cited

U.S. PATENT DOCUMENTS

| 4,301,322 | A  | * | 11/1981 | Amick | 136/256 |
|---|---|---|---|---|---|
| 5,763,118 | A  | * | 6/1998 | Stafford et al. | 429/163 |
| 6,805,998 | B2 | * | 10/2004 | Jenson et al. | 429/162 |
| 7,583,506 | B1 |   | 9/2009 | Huang et al. | |
| 2003/0038610 | A1 | * | 2/2003 | Munshi et al. | 320/101 |
| 2003/0133865 | A1 | * | 7/2003 | Smalley et al. | 423/447.1 |
| 2003/0221717 | A1 | * | 12/2003 | Dessel | 136/206 |
| 2004/0038251 | A1 | * | 2/2004 | Smalley et al. | 435/6 |
| 2005/0238810 | A1 | * | 10/2005 | Scaringe et al. | 427/249.1 |
| 2006/0048809 | A1 | * | 3/2006 | Onvural | 136/212 |

* cited by examiner

*Primary Examiner* — Thanh-Truc Trinh
(74) *Attorney, Agent, or Firm* — Klintworth & Rozenblat IP LLC (57) ABSTRACT

The invention discloses differing embodiments of integrated solar cells and battery devices, in addition to disclosing methods of distributing energy. In one embodiment of the invention, an integrated solar cell and battery device may include a top layer, a middle layer, and a bottom layer. The top, middle, and bottom layers may be made of Nanoscale material, and may comprise sublayers. The top layer may include one or more solar cells, while the bottom layer may include a battery. The middle layer may direct thermal energy from the top layer to the bottom layer. The device may also include one or more electronic circuits adapted to control electrical charge along one or more paths between the solar cells and the battery. The Nanoscale materials of the top, middle, and bottom layers may comprise a plurality of Nanotubes or a plurality of Nanowires.

21 Claims, 9 Drawing Sheets

INTEGRATED SOLAR CELL AND BATTERY DEVICE INCLUDING CONDUCTIVE ELECTRICAL AND THERMAL PATHS

BACKGROUND OF THE INVENTION

Structural components are often designed and manufactured separately from non-structural components. For example, vehicles (including automobiles, trains, aircraft, ships, and spacecraft) are often produced by assembling and integrating components from different subsystems. These subsystems may include subsystems directed towards a variety of functions such as structure, power, control, actuation, thermal management, communication, navigation, and propulsion. Individual connections, through wires, cables, waveguides, heat-pipes, switches and other means or devices, may be necessary to interconnect such components for purposes such as data communication, power distribution, vehicle operations control, and thermal management. The resultant system is often full of plumbing, connectors, and interconnecting links.

The complex resultant system may lead to reduced performance, durability issues, higher cost, and other types of problems. For example, the reliability of a subsystem may be far below what is achieved by a structure due to the multiplied deterioration over time and usage of the various components of the subsystem. For instance, every connector of the subsystem may introduce performance degradation, in areas such as electrical conductivity, signal noise, thermal conductivity, and mechanical strength. Moreover, transmission through interconnections may create waste (e.g. power dissipation through distribution may become heat and lead to potential thermal issues) and may further reduce performance.

An integrated device, and method for its use, is needed which may solve one or more problems in one or more existing devices.

SUMMARY OF THE INVENTION

In one aspect of the invention, an integrated solar cell and battery device is disclosed. The device comprises a top layer of one or more solar cells. The top layer further comprises one or more top sublayers. The top sublayer is comprised of Nanoscale material for directing thermal energy from a backside of the solar cell through the top layer. The device further comprise a bottom layer comprising a first bottom volume, and a second bottom volume for thermal distribution. A battery is fixed to the first bottom volume. The bottom layer further comprises one or more bottom sublayers. The bottom sublayer is comprised of Nanoscale material for directing thermal energy from the battery to an external heat sink. The device additionally comprises one or more middle-layers between the top layer and the bottom layer. At least one of the middle layers is comprised of Nanoscale material for directing thermal energy from the top layer to the bottom layer. The device also comprises one or more electronic circuits adapted to control electrical charge along one or more paths between the solar cells and the battery.

In another aspect of the invention, another embodiment of an integrated solar cell and battery device is provided. The device comprise a top layer of one or more solar cells, wherein the top layer further comprises one or more top sublayers. The top sublayer is comprised of at least one of a plurality of Nanotubes and a plurality of Nanowires for directing thermal energy from a backside of the solar cell through the top layer. The device additionally comprises a bottom layer comprising a first bottom volume and a second bottom volume for thermal distribution. A battery is fixed to the first bottom volume. The bottom layer further comprises one or more bottom sublayers, wherein the bottom sublayer is comprised of at least one of a plurality of Nanotubes and a plurality of Nanowires for directing thermal energy from the battery to an external heat sink. The device also comprises one or more middle-layers between the top layer and the bottom layer. At least one of the middle layers is comprised of at least one of a plurality of Nanotubes and a plurality of Nanowires for directing thermal energy from the top layer to the bottom layer. The device additionally comprises one or more electrical paths between the solar cells and the battery.

In a further aspect of the invention, a method is disclosed for distributing energy. Thermal energy is directed from a solar cell through a top layer of a device. At least a portion of the top layer is made of Nanoscale materials. The thermal energy is directed from the top layer through a middle layer of the device. At least a portion of the middle layer is made of Nanoscale materials. The thermal energy is directed from the middle layer to a bottom layer of the device. At least a portion of the bottom layer is made of Nanoscale materials. The thermal energy is directed from the bottom layer to a battery. The thermal energy is directed from the battery to an external heat sink. Electrical charge is controlled along one or more paths between the solar cells and the battery.

In yet another aspect of the invention, an intergrated solar cell and battery device is disclosed. The device comprises an outer portion having one or more solar cell and a Nanoscale material comprising a thermally conductive path for conveying heat energy away from the one or more solar cell. The device further comprises an inner portion including a battery and Nanoscale material defining a thermally conductive path for conveying heat energy away from the battery. An electrically conductive path extends between the solar cell and the battery.

These and other features, aspects and advantages of the invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The instant invention may incorporate highly conductive electrical and thermal paths made of Nanoscale materials. It should be noted that throughout the specification, when the term Nanoscale materials is used, the term is referring to materials of Nanoscale size, which in one embodiment may be defined as materials having diameters of 1 to 100 Nanometers (nm). In other embodiments, Nanoscale sized materials may be of varying sizes. The Nanoscale materials may include a plurality of Nanotubes, a plurality of Nanowires, a plurality of Nanorods, and/or other types of Nanoscale sized materials and/or items. The Nanoscale sized materials may be made of Carbon, such as Carbon Nanotubes, or may be made of other materials known in the art. The invention may be used to build components, assemblies, sub-assemblies, sub-systems, and systems. Moreover, the invention may be used to build structural elements, such as panel and heat sinks, in addition to non-structural elements, such as sensors, analog and digital circuits, actuators, and valves. The resultant System-on-Panel (SOP) may integrate structural components, such as a panel, with non-structural components, such as a system. In one embodiment, the System-on-Panel may integrate a solar cell with a battery. Electrical and thermal conductive paths may be incorporated in order to allow electrical signals and power to be transmitted between devices. The heat generated as a result of such activities can then be removed and rejected. The integration of structural and non-structural components may improve performance, reduce system weight, and/or lower the cost in a wide range of potential applications.

The use of Nanoscale materials may reduce the problem of integrating components, such as subsystems or capabilities which are largely electrical, electronic, and/or electromechanical in nature (e.g. power, computer, valve and actuator), with structural elements. For instance, one application where the invention may be utilized involves "smart skin" in airplanes. The term "smart skin" refers to the embedding of sensors and actuation devices beneath the surface of a structural element (such as a wing on aircraft) so that external conditions (e.g. aerodynamic pressure) can be sensed and adjustments can be made (e.g. changing the size, shape, or angle of the wing) to enable the airplane to operate optimally under the conditions of the operating environment. An issue in implementing "smart skin" may be the complexity involved in powering the sensors and actuation devices, collecting data and status from the sensors and actuation devices, and directing the sensors and actuators. The added wiring, cabling and connectors may not only increase the weight and cost of the system, but may also lead to a significantly more complex system. With increased system complexity, the resultant system reliability may be significantly reduced and may render "smart-skin" impractical. The same types of problems may occur generally in structure health monitoring, and vehicle health monitoring, both of which may require a large number of sensors. In one embodiment, varying types of System-On-Panel systems may be produced which may reduce one or more of the above referenced problems in varying types of applications, both in the aeronautical and non-aeronautical fields.

Figure 1:
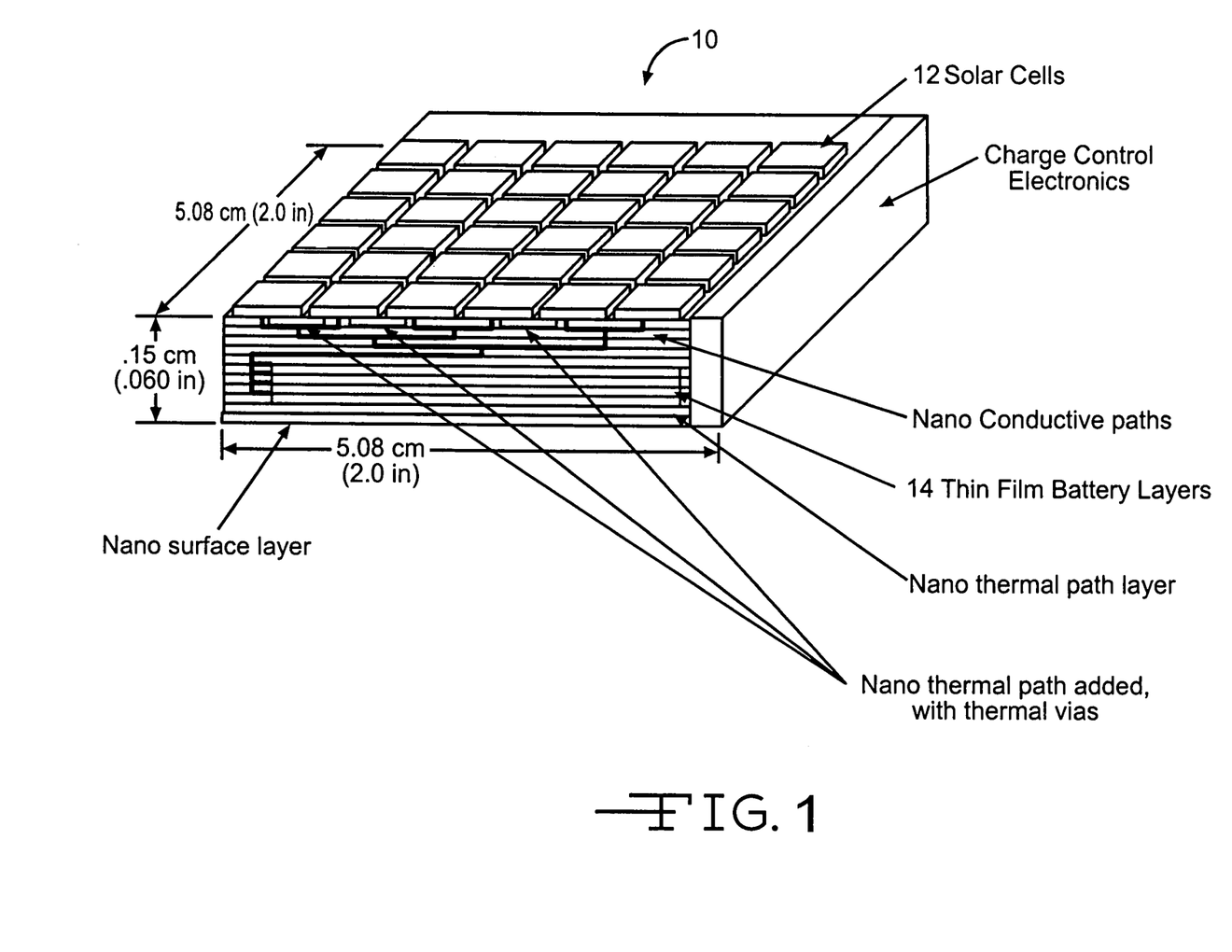
FIG. 1 depicts a perspective view of one embodiment of the invention comprising an integrated solar cell and battery design.

FIG. 1 depicts one embodiment 10 of the invention by illustrating the concept of System-On-Panel by way of a device which integrates one or more solar cells 12 with a battery 14. In one embodiment, the battery 14 may be embedded. In the device, solar energy may be collected by solar cells 12 and stored in the battery 14. Nanoscale materials may be utilized to construct conductive electrical and thermal paths (as shown in FIGS. 3 and 4) within the device illustrated in FIG. 1 in order to accomplish energy collection and storage functions. In some embodiments, the electrical and thermal paths may be made of varying Nanoscale materials, and in other embodiments, uniform Nanoscale materials may be used for all electrical and thermal paths. The Nanoscale materials shown may comprise at least one of a plurality of Nanotubes (i.e Carbon Nanotubes), a plurality of Nanowires, a plurality of Nanorods, or other Nanoscaled materials known in the art. Utilizing Nanoscale materials which are compatible with the structural panel may enable the construction of an integrated device which may perform various functions. In order to describe the construction and usage of Nanoscale conductive paths, the integrated solar cell and battery design 10 of FIG. 1 may be sub-divided into the following three sub-panels shown in FIG. 2: (1) top solar cell sub-panel 16; (2) mid-distribution (thermal and electrical) sub-panel 18; and (3) bottom battery (e.g. thin film) sub-panel 20. Each of the three referenced sub-panels (also referred to as layers) may be comprised of one or more sub-layers. The three respective sub-panels (layers) are each detailed below. In differing embodiments, there may be a varying number of sub-panels, including more or less than the three sub-panels shown in the Figures. In still other embodiments, the sub-panels (layers) may be in any size, shape, orientation, or configuration. It should be noted that throughout this specification, the use of the words "top," "bottom," and "middle" is not meant to limit the invention to any specific orientation, and in varying embodiments, the sub-panels and other components of the invention may be in a variety of orientations with respect to one another.

Figure 2:
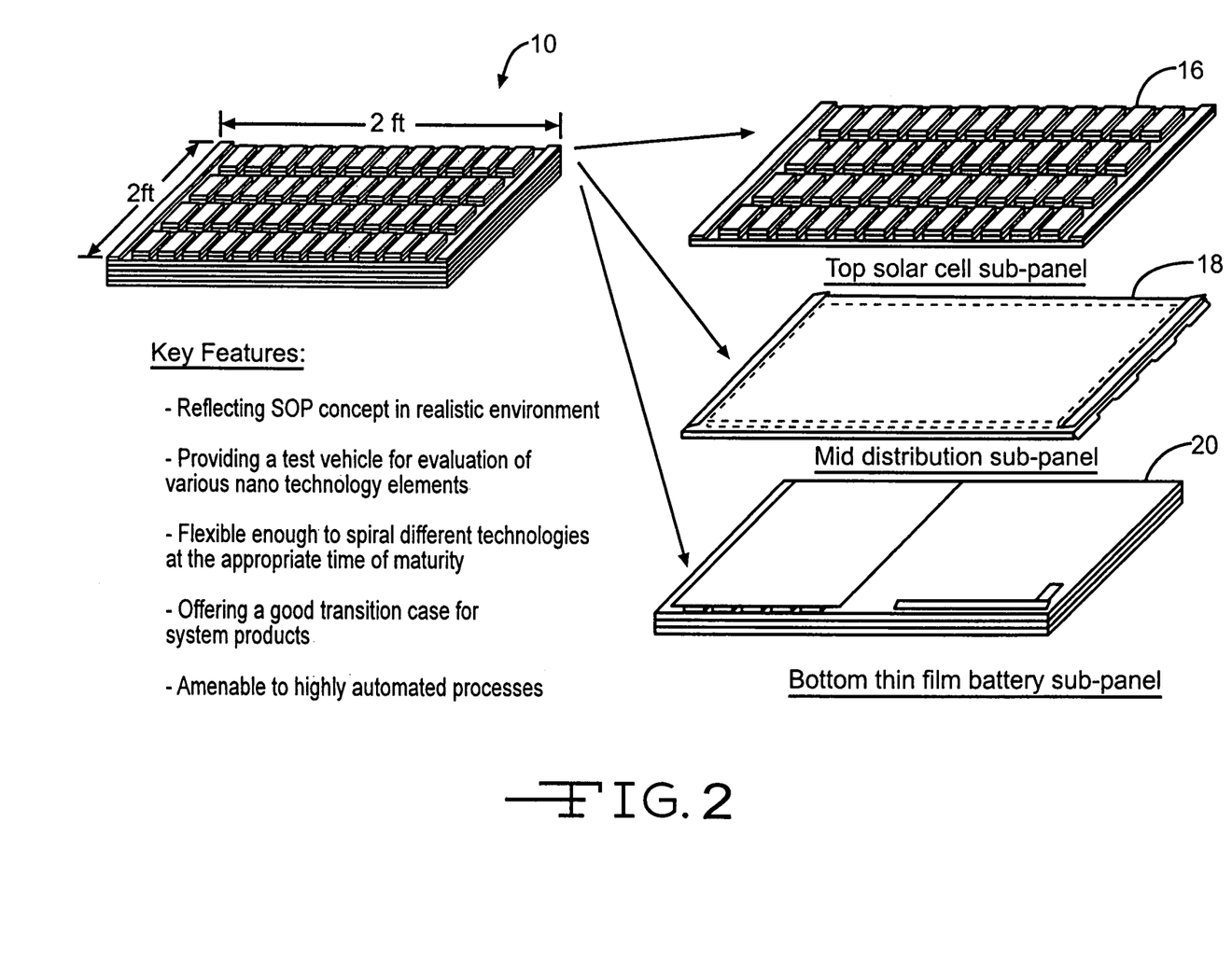
FIG. 2 depicts a perspective, cut-away, exploded view of the integrated solar cell and battery design of FIG. 1 subdivided into three sub-panels
Figure 3:
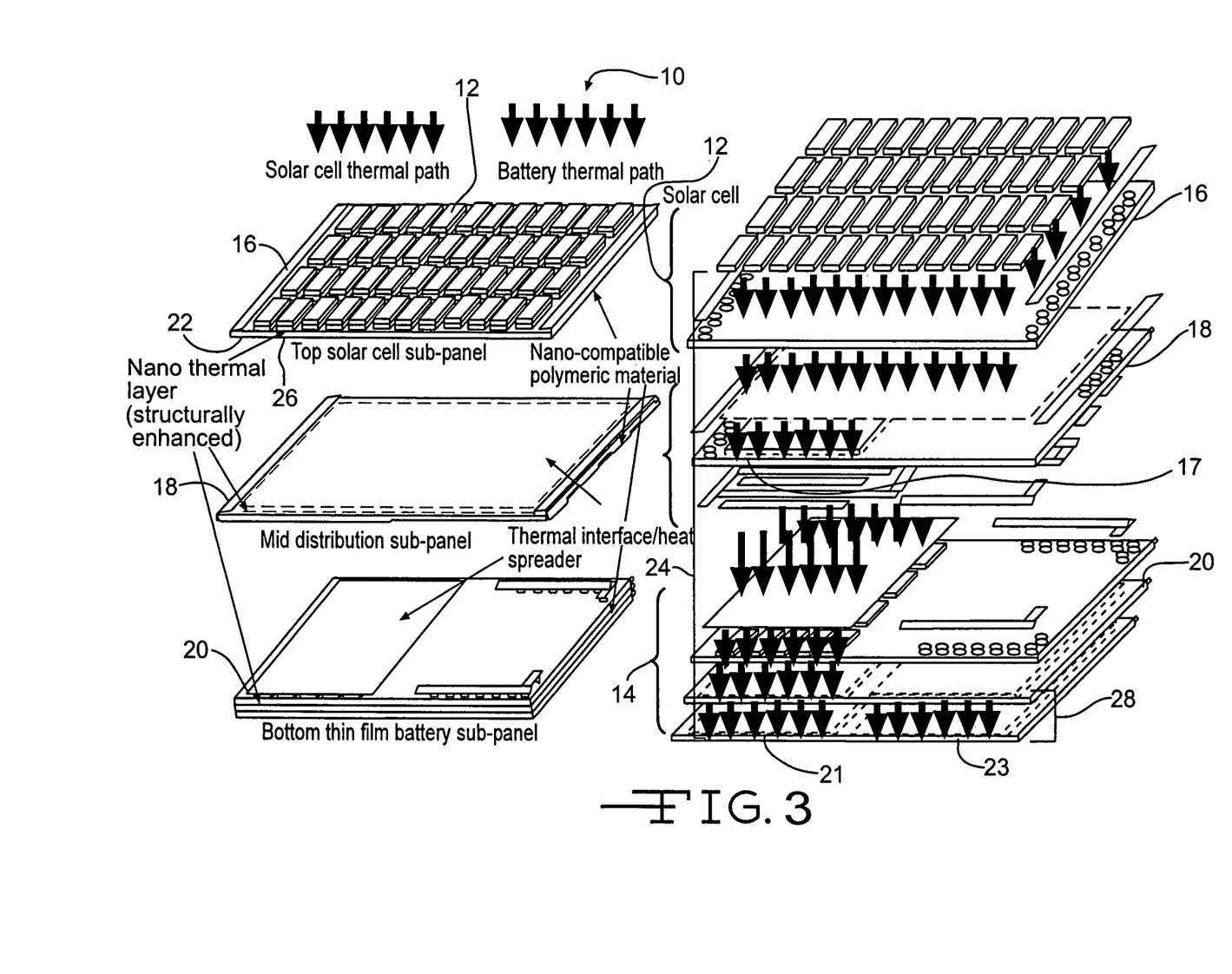
FIG. 3 depicts a perspective, cut-away, exploded view of the thermal design of the sub-panels shown in FIG. 2.
Figure 4:
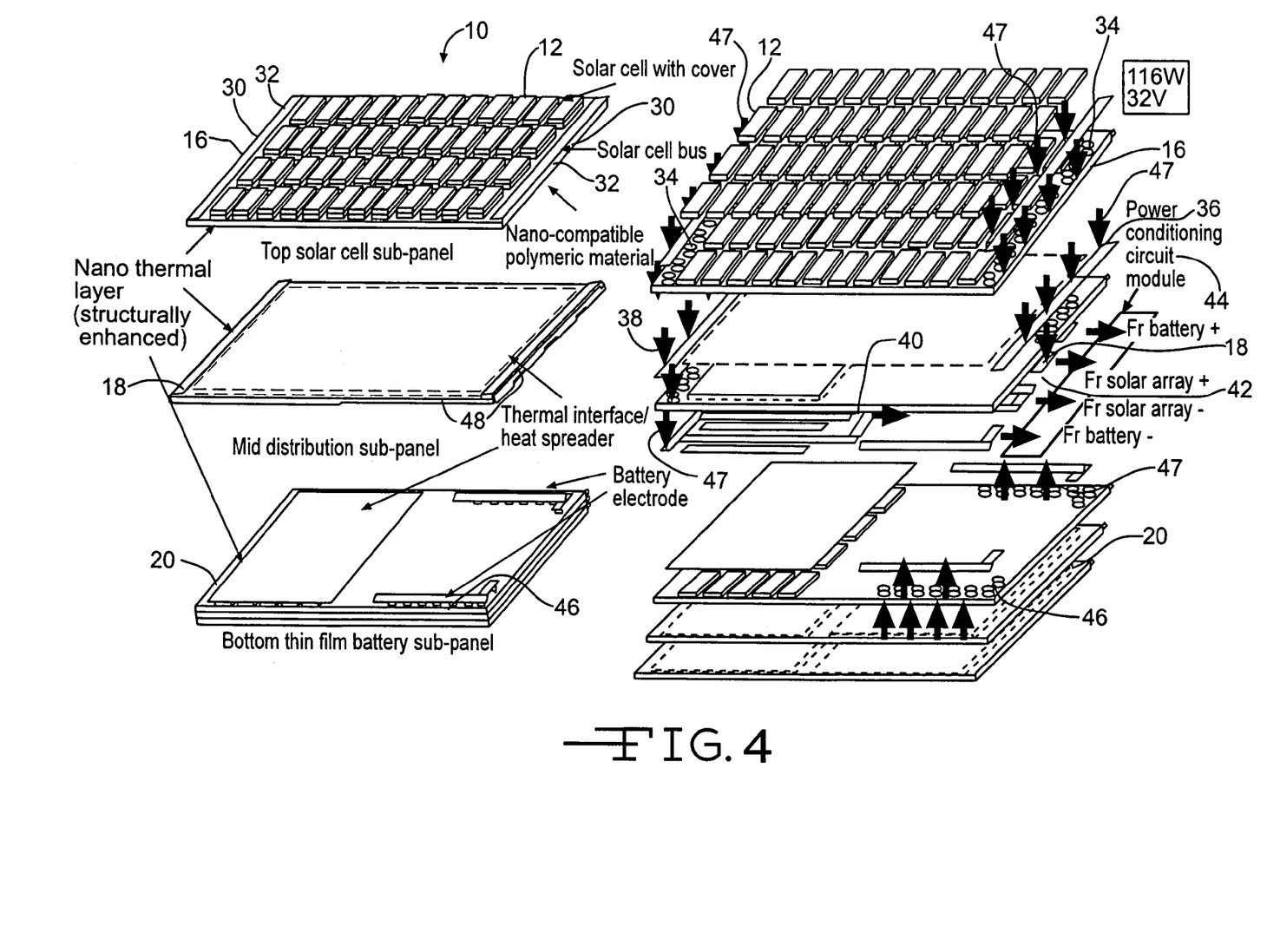
FIG. 4 depicts a perspective, cut-away, exploded view of the overall system level electrical signal routing and design of the sub-panels shown in FIG. 2.

FIG. 3 depicts the thermal design of the sub-panels 16, 18, and 20 shown in FIG. 2, by illustrating the heat flow from the heat sources of the SOP system to the backside plate 22 which is designated as the area exposed to the colder environment. The major heat sources within the panel include a solar cell 12 and a thin film battery 14. In a first heat distribution path 24, solar cell heat is dissipated in the top sub-panel 16 through the solar cell plate 22 and then collected in the left region 17 of the mid-distribution sub-panel 18, and passed onto the left region 21 of the bottom sub-panel 20. Heat may be dissipated through a back-side 26 of the solar cell plate 22. In varying embodiments, the back-side 26 of the solar cell plate 22 may be in a variety of orientations or configurations. In a second heat distribution path 28, the heat generated from the thin film battery 14 may be directly coupled to the right side 23 of the bottom sub-panel 20. The two separate paths 24 and 28 shown in FIG. 3 is only one embodiment of how the many different heat load scenarios may be dealt with. In other embodiments, a wide variety of solar cells and/or battery products may be utilized with differing paths. For instance, in varying embodiments one or more conductive paths may be directed away from or around the battery, while in other embodiments, one or more conductive paths may be directed towards or to the battery. In still other embodiments, when two or more heat sources are included in the design, the paths may be combined at optimum locations to achieve an improvement in performance. Combining two or more paths may be achieved through additional use of routing layers in the bottom sub-panel.

FIG. 4 depicts the overall system level electrical signal routing and design of the sub-panels 16, 18, and 20 shown in FIG. 2. As shown, electricity generated by the solar cells 12 may be collected at the power buses 30 located at the edges 32 of the top sup-panel 16. Electricity collected at the buses 30 may then be transmitted to the mid routing sub-panel 18 through electrical vias (or channels) 34 positioned underneath the power buses 30. One bus electrode 36 positioned at the right side may use only vias 34 while another bus electrode 38 may go through routing lines 40 to get to the right edge 42. Both electrodes may interface with power management electronics 44 whose current design may require their attachment at the right edge 42 of the mid sub-panel 18.

Electrical contacts needed for the battery 14 may be achieved through vias (channels) 46 of the bottom sub-panel 20 and through the lined edges 48 at the surface of the mid sub-panel 18. This design is only an example that may be utilized if the power management electronics 44 are attached at the right edge 42 of the SOP. Location of this power management electronic box may be modified depending upon the specific application needs. Changes in the electrical path routing lines can also be accommodated using similar principles and processes. One or more electronic circuits 44, such as power conditioning circuits, may be used to control electrical charge along one or more paths between the solar cells 12 and the battery 14. The one or more paths 47 between the solar cells 12 and the battery 14 may comprise electrically conductive Nanoscale material which form one or more electrical paths 47 between the top layer 16, the middle layer 18, and the bottom layer 20. The electrically conductive Nanoscale material forming the one or more paths 47 between the solar cells 12 and the battery 14 may comprise at least one of a plurality of Nanotubes and a plurality of Nanowires. The bottom layer 20 may further comprise Nano-conductive paths, which may comprise a plurality of Nanotubes or Nanowires, which are adapted to electrically couple the battery 14 to one or more electronic devices.

Figure 5:
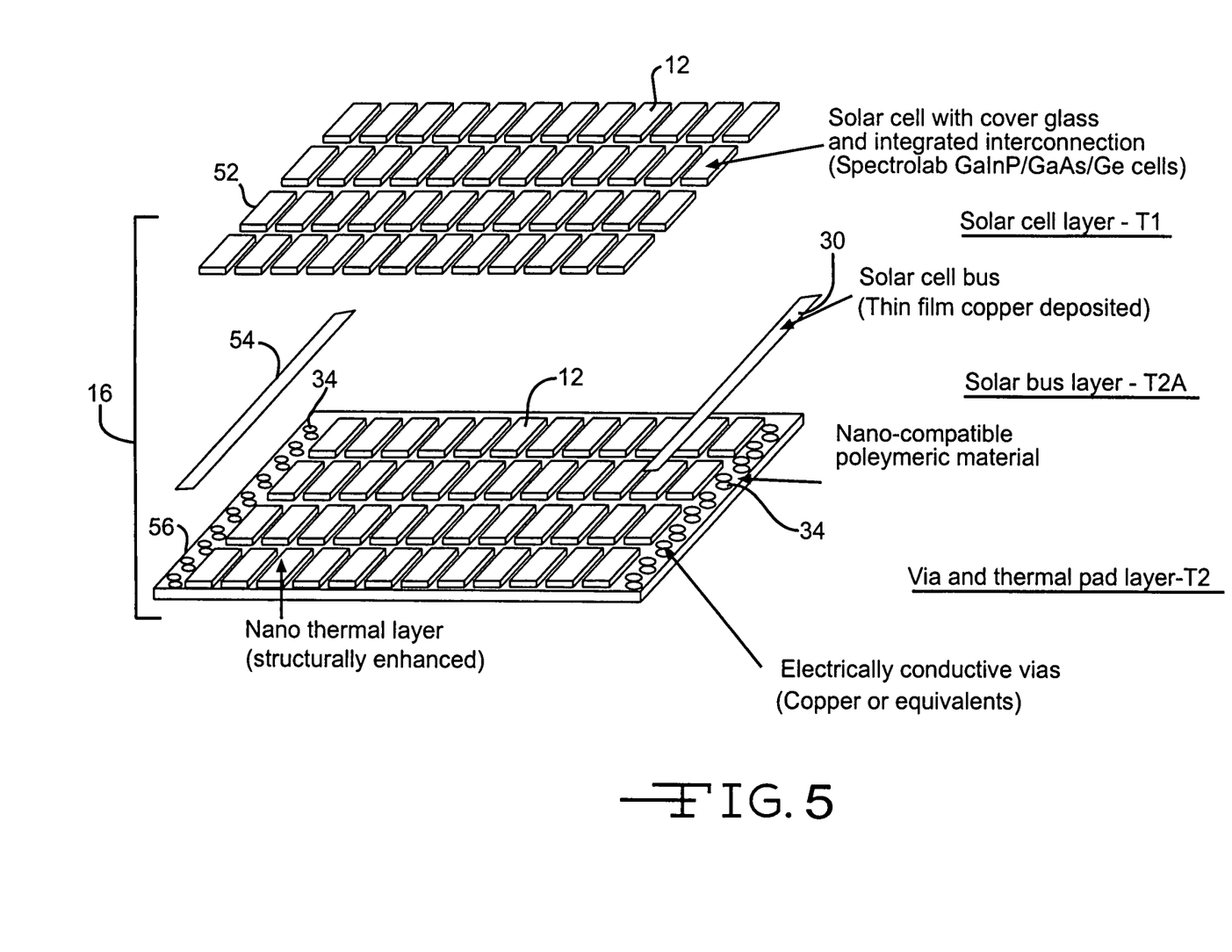
FIG. 5 depicts a perspective, cut-away, exploded view of the top solar cell sub-panel design of FIG. 2.

FIG. 5 depicts the top solar cell sub-panel design 16 of FIG. 2, along with the candidate materials for the top solar cell sub-panel 16. As shown, the top layer 16 may comprise a solar cell sublayer 52 having solar cells, a solar bus sublayer 54 having solar cell buses, and a via and thermal pad sublayer 56 having channels 34. In other embodiments, the top sub-panel (or top layer) 16 may have a varying number of sublayers, of varying shapes, sizes, configurations, orientations, and functions. The top sublayer 52 may be comprised of Nanoscale material for directing thermal energy from a backside of the solar cell 12 through the top layer 16. Solar cells 12 suitable for the specific application may be bonded at the top of the top sub-panel 16. Examples of solar cells which may be utilized include high efficiency triple-junction solar cells (e.g. $GaInP_2/GaAs/Ge$), single junction solar cells (e.g. GaAs or GaAs on Ge), high efficiency silicon cells, thin film based cells, or other cells known in the art. Regardless of the choice of solar cell technology, the SOP basic processing flow may substantially remain the same. However, the choice of solar cell technology may affect design details such as the size and position of solar cell pads on the sub-panel. Thermally conductive Nanoscale materials may be incorporated under the solar cell pads as through-thickness pockets. In one embodiment, the top layer 16 may comprise a plurality of Nanotubes or Nanowires for directing thermal energy from the backside of the solar cell 12 through the top layer 16. Electricity generated by the solar cells 12 may be collected at the buses 30 which may be formed by thin film deposition. Vias (channels) 34 utilizing electrically conductive Nanoscale materials may be incorporated into the body of the top sub-panel 16. In other embodiments, the electrically conductive via channels 34 may comprise varying materials, such as copper, or other materials.

Figure 6:
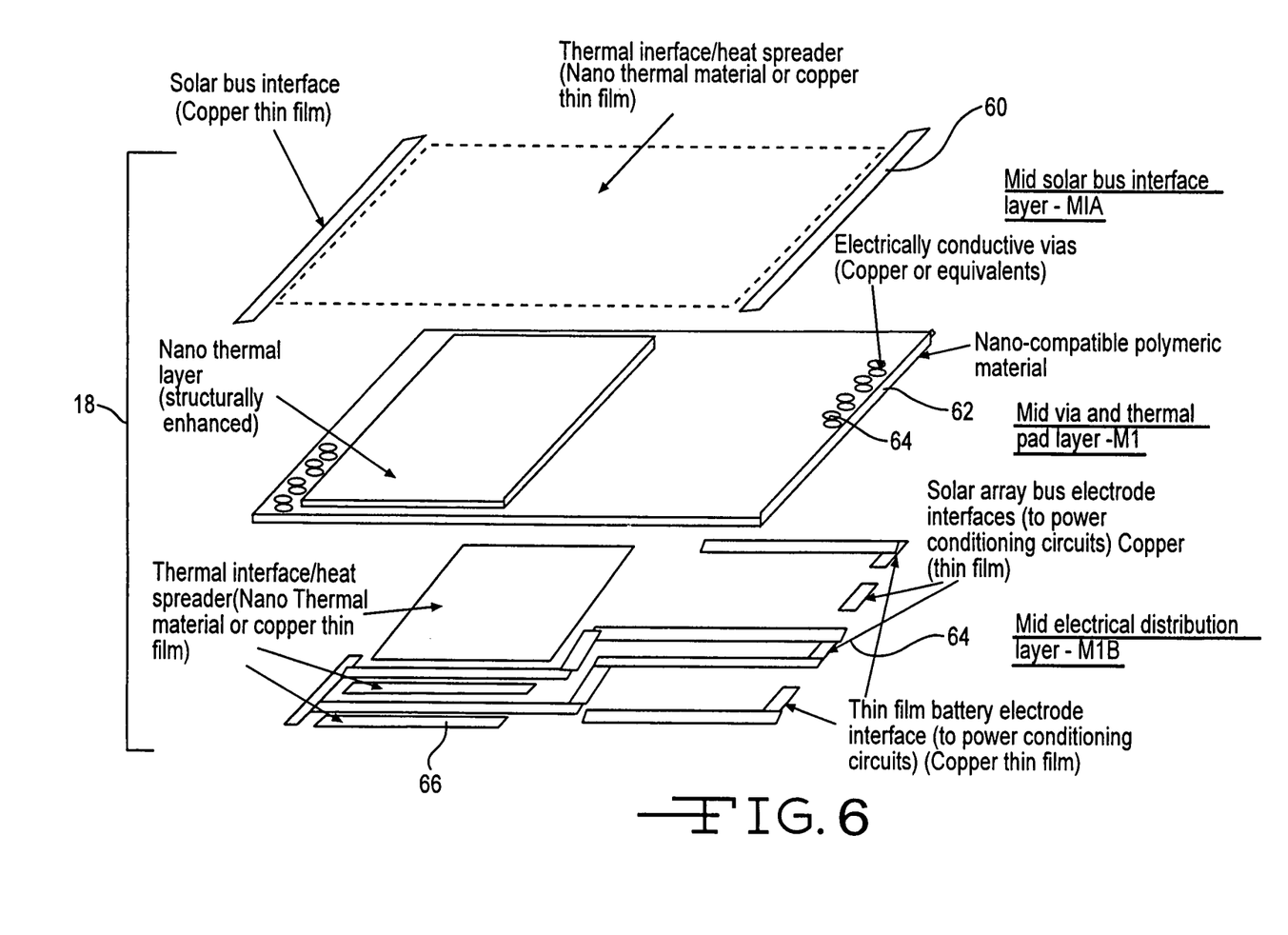
FIG. 6 depicts a perspective, cut-away, exploded view of the mid-distribution sub-panel design of FIG. 2.

FIG. 6 depicts the mid-distribution sub-panel 18 of FIG. 2, along with the candidate materials for the mid-distribution sub-panel 18. As shown, the middle layer 18 may comprise a mid-solar bus interface sublayer 60 having buses which interface with the solar cells, a via and thermal pad sublayer 62 having channels 64 for distributing heat, and a distribution layer 64 adapted to distribute heat and/or electricity. In other embodiments, the mid-distribution sub-panel (or middle layer) 18 may have a varying number of sublayers, of varying shapes, sizes, configurations, orientations, and functions. This sub-panel 18 may not only serve the purpose of providing paths, which may be vertically extending or in other configurations, for distributing both electricity and heat from the top layer 16 to the bottom layer 20 of the device 10, but may also route electricity laterally utilizing one or more laterally running paths. In other embodiments, the paths may be in a variety of directions, orientations, and configurations. The design may use the left side for thermal purpose while the right side may handle electrical routing needs. In other embodiments, varying parts of the sub-panel 18 may be utilized for varying purposes. Nanoscale materials of high thermal and electrical conductivity may be incorporated in the main body of the sub-panel 18. In one embodiment, the middle layer 18 may be comprised of Nanoscale materials, such as a plurality of Nanotubes or Nanowires, for directing thermal energy from the top layer 16 to the bottom layer 20. Lateral electrical routing may be achieved through the placing of thin film conductive paths 66 at the bottom of the sub-panel 18. The Nanoscale material of the middle-layer 18 may be structured to direct thermal energy from a first area to a distinct second area in the middle-layer 18. In other embodiments, the middle-layer 18 may be structured to spread thermal energy selectively or evenly across the middle-layer 18. The electrically conductive vias 64 in the middle-layer 18 may comprise copper or other materials. In other embodiments, the electrically conductive vias 64 may comprise Nanoscale materials.

Figure 7:
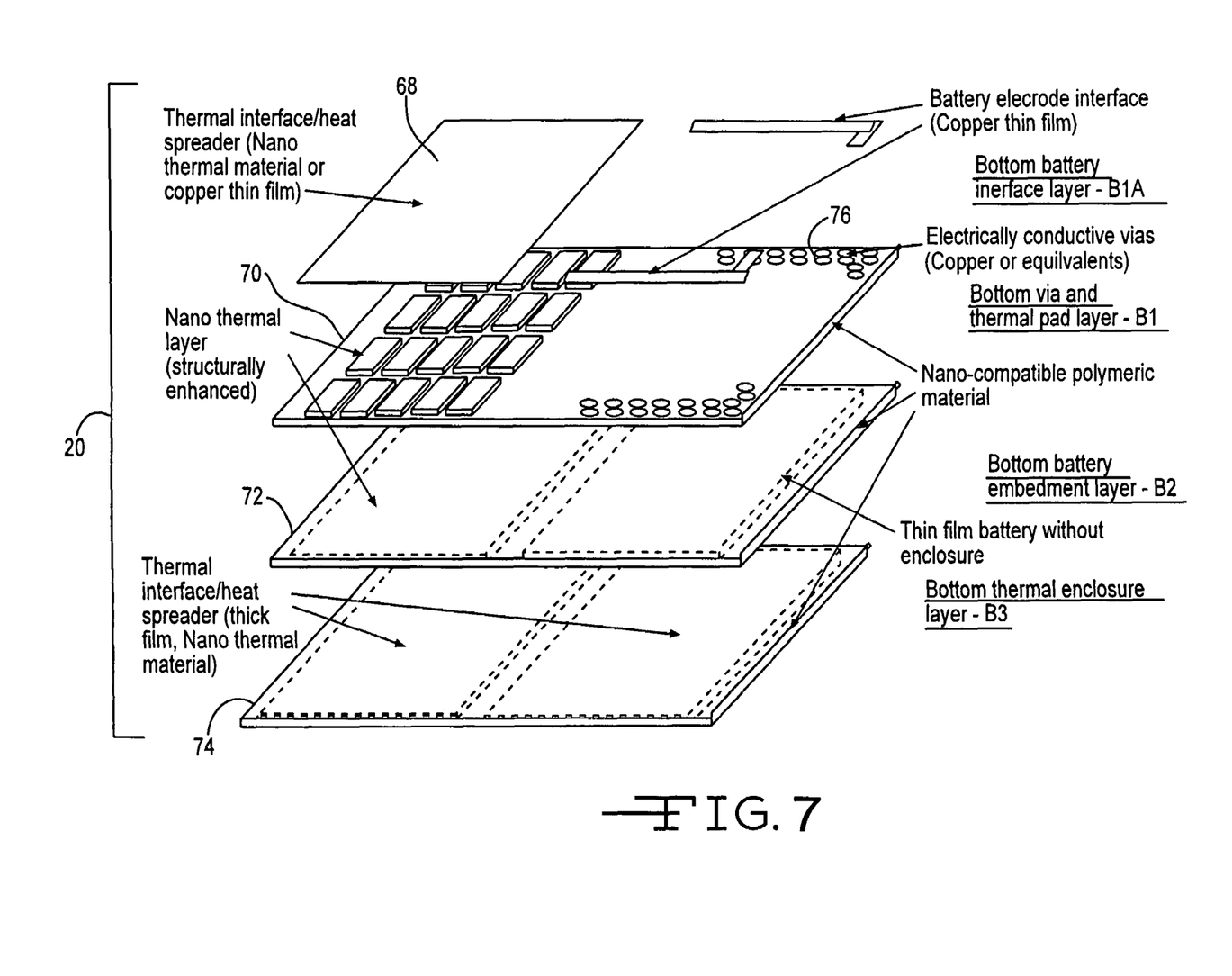
FIG. 7 depicts a perspective, cut-away, exploded view of the bottom battery sub-panel design of FIG. 2.

FIG. 7 depicts the bottom battery sub-panel 20 of FIG. 2, along with the candidate materials for the bottom battery sub-panel 20. As shown, the bottom layer 20 may be comprised of one or more bottom sublayers, which in one embodiment may comprise a battery electrode interface sublayer 68 for interfacing with the battery 14, a bottom via and thermal pad layer 70 containing channels which may distribute heat and/or electricity, a bottom battery layer 72 containing the battery 14, and a bottom thermal enclosure layer 74 for enclosing and spreading heat. The bottom layer 20 may comprise a bottom volume having the battery 14 fixed to the bottom volume, and may also comprise a second bottom volume for thermal distribution. The bottom layer 20 may contain an embedded battery 14. Embedment of the battery 14 may be easily achieved when the battery 14 has an enclosure. It is preferred to use the body material of the bottom sub-panel 20 as the enclosure for the battery 14 if its material compatibility is acceptable. This may achieve significant weight savings since weight of the battery 14 is allocated for the enclosure. The bottom sub-panel 20 may also provide through-thermal paths using Nanoscale conductive materials. Moreover, the bottom layer 20 may be comprised of Nanoscale materials, such as a plurality of Nanotubes or Nanowires, for directing thermal energy from the battery 14 to an external heat sink. Nanoscale materials may direct thermal energy from the middle layer 18 to the bottom volume of the bottom layer 20 which may be used for thermal distribution. Heat produced by the solar cells 12 may flow down into the bottom sub-panel 20 to the bottom of the sublayer 74 through the sub-panel's left side. The bottom of sublayer 74 may be connected to a system cooling plate. The thermal path for the battery 14 may be positioned separately on the right side of the bottom sub-panel 20. Electricity may be transmitted up through vias 76 which are connected to the middle sub-panel 18, which may then be routed to the terminals of the power management electronic circuits 44 located in the right edge of the middle sub-panel 18. The electrically conductive vias 76 may comprise copper or other materials. In other embodiments, the electrically conductive vias 76 may comprise Nanoscale materials. In still other embodiments, the bottom sub-panel 20, and its pathways for distributing heat and/or electricity, may be in a variety of shapes, sizes, orientations, and configurations.

Figures 8, 8A, 8B:
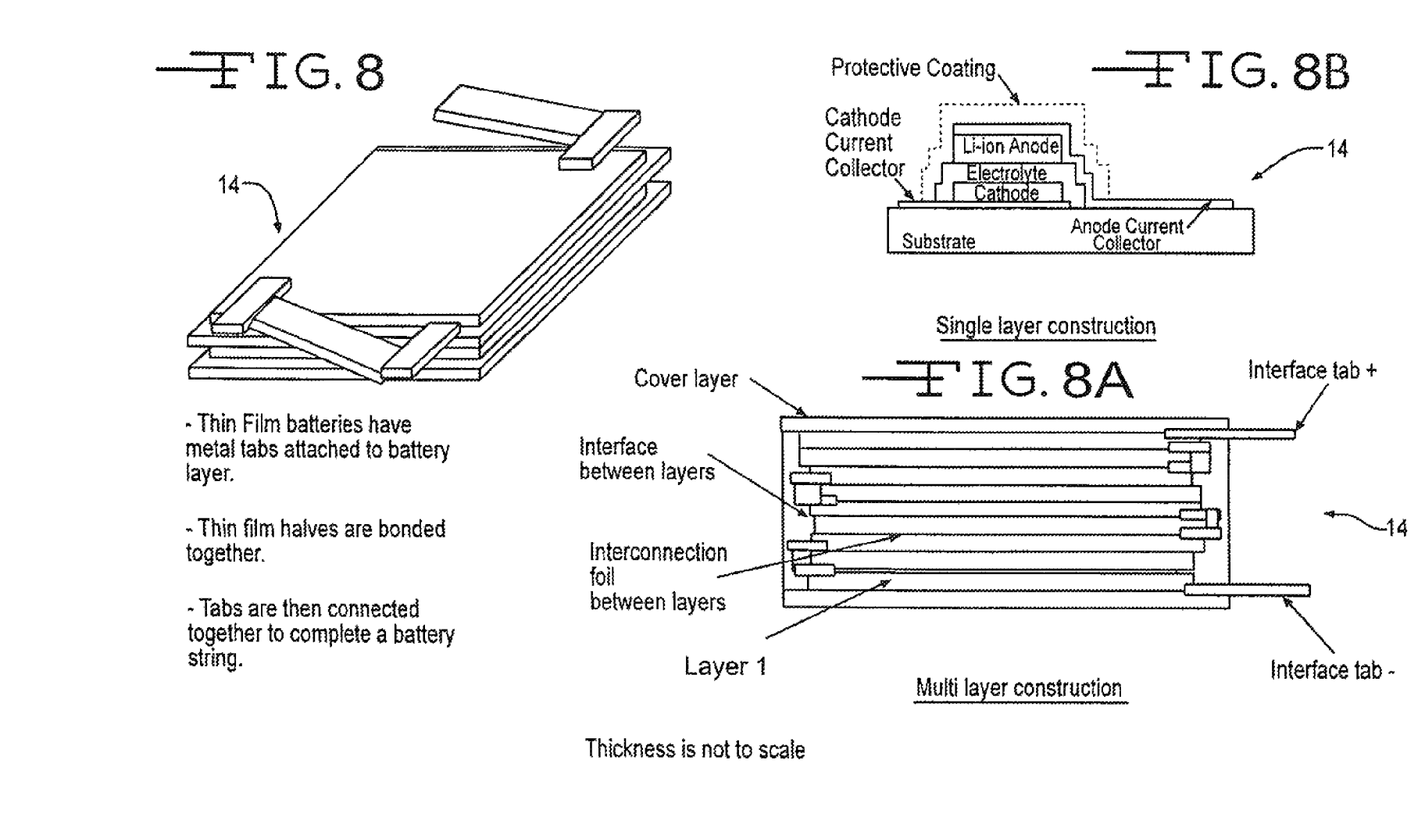
FIGS. 8, 8A, and 8B depict respectively perspective (8) and side views (8A) of a multi-layered battery embodiment which may be used for the battery of FIG. 1, and a side view (8B) of another single-battery embodiment which may be used for the battery of FIG. 1.

FIGS. 8 and 8A depict perspective and side views of one embodiment of a multi-layer battery 14 which may be used for the battery 14 of FIG. 1. FIG. 8B depicts a side view of another embodiment of a single-layer battery 14 which may be used for the battery 14 of FIG. 1. The battery 14 may be less than three millimeters in at least one direction along the battery 14. In other embodiments, the battery 14 may be any type of battery suitable for embedding. The multi-layer battery 14 of FIGS. 8 and 8A may be connected in series to produce the appropriate voltage level to closely match the operational voltage. By changing the electrode connections to be in parallel, a high current battery design at lower voltage levels may be achieved. This may offer benefits for certain applications. Further, weight may be reduced by using the body material of the bottom sub-panel 20 as the battery 14 enclosure in order to eliminate structural enclosure material. The produced weight savings may be a key enabler for certain applications, such as in the space-craft field.

Under the invention, Nanotechnologies may be used to create structure elements embedded with paths (e.g. thermal, power, signal, and data), controlling devices (e.g. switches and valves), sensors (e.g. temperature, pressure, vibration, strain, radiation and light), and intelligent devices (e.g. processor, analog-to-digital converter, signal processing, and Field Programmable Gate Array (FPGA)). Nanotechnology may comprise the technology development at the atomic, molecular or macromolecular levels in length scale of approximately 1-100 Nanometer range. Nanotechnology may offer significant performance improvement. For example, Carbon Nanotube (CNT) is a new form of carbon which may be configurationally equivalent to a two dimensional Graphene sheet rolled into a tube.

Figure 9:
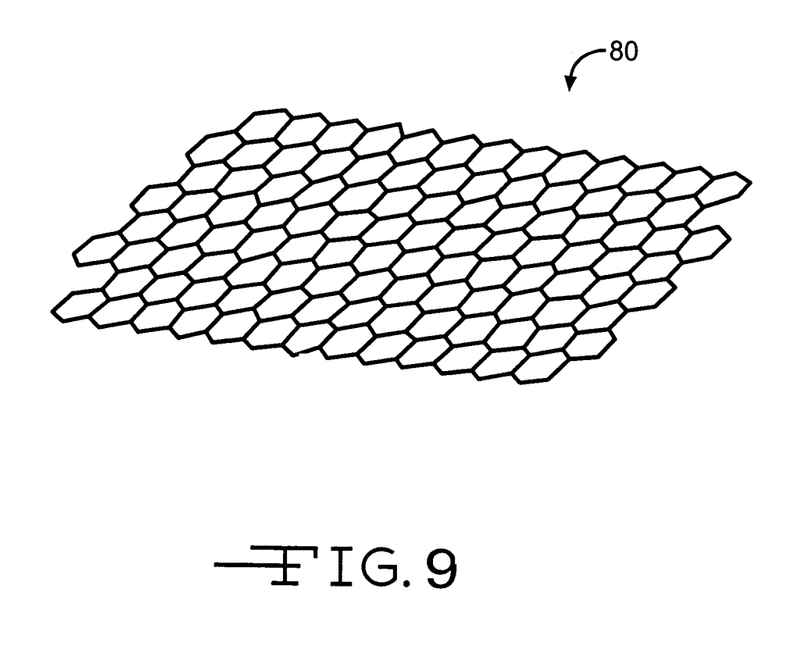
FIGS. 9 and 9A illustrate respectively perspective views of a Carbon Nanotube sheet (9), being rolled up into a single wall Carbon Nanotube (SWNT) (9A), which may be utilized in the varying embodiments of the invention.
Figure 9A:
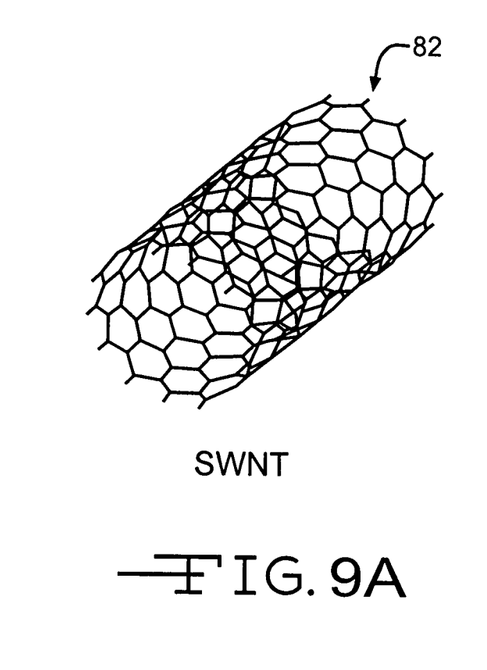

FIGS. 9 and 9A illustrate respectively perspective views of a Carbon Nanotube sheet 80, as shown in FIG. 9, being rolled up into a single wall Carbon Nanotube (SWNT) 82, which may be utilized in the varying embodiments of the invention. The Nanotubes may have diameters in the range of a few Nanometers (<100 Nanometers) and their lengths may vary from micrometers to millimeters. Each Nanotube may comprise a single molecule composed of a hexagonal network of covalently bonded Carbon atoms. Carbon Nanotube may have the potential to improve the strength over steel by several hundred times, may improve thermal conductivity over aluminum by 600 times, and may increase electrical conductivity over that of copper by orders of magnitude.

The invention also includes methods for distributing energy. The methods of the invention may utilize any of the disclosed integrated solar cell and battery devices to distribute energy. In one embodiment, thermal energy may be directed from a solar cell through a top layer of such a device. The thermal energy may be directed from the top layer, through a middle layer, to a bottom layer of the device. At least a portion of the top, middle, and bottom layers may be made of Nanoscale materials. The Nanoscale materials of one or more layers may comprise a plurality of Nanotubes or Nanorods. The thermal energy may be directed from the bottom layer to a battery, which may be embedded in the bottom layer. The thermal energy may be directed from the battery to an external heat sink. Electrical charge may be controlled along one or more paths between the solar cells and the battery. The step of controlling the electrical charge along the one or more paths may be accomplished utilizing one or more electronic circuits.

In SOP systems under the invention, Nanotechnologies may be used to provide an increase in strength and elasticity of the structure or panel utilizing Carbon Nanotube materials. Moreover, data, signal, and power paths may be constructed utilizing Nanomaterial to exhibit superior electrical conductivity. Nanomaterial exhibiting superior thermal conductivity may be utilized to construct the thermal paths.

The instant invention may be utilized for satellites having embedded power wires. Another application for the invention may involve commercial aircraft in which power and electrical signals can be embedded or installed on the surface of the secondary panels, e.g. in passenger compartments and galleys. The invention may be utilized in applications throughout the airline industry. Moreover, the invention may be utilized in applications where large volumes of products are produced, such as the production of automobiles and televisions.

The invention may reduce system complexity, may improve system reliability, may reduce system volume and weight, may improve maintenance and durability, may improve fuel performance, may reduce cost, and/or may reduce other problems. The improvements may be substantially proportional to the number of end items, connectors, and wire/cables being replaced by the SOP. The invention may further reduce system design, development, integration, and test time.

It should be understood, of course, that the foregoing relates to exemplary embodiments of the invention and that modifications may be made without departing from the spirit and scope of the invention as set forth in the following claims.

We claim:

1. An integrated solar cell and battery device, the device comprising:
    a top layer of one or more solar cells, said top layer comprising one or more top sublayers;
    a bottom layer comprising: a first bottom volume comprising a battery layer comprising a battery and a thermal path, wherein the battery layer is integrally embedded within said first bottom volume; a second bottom volume for thermal distribution; and one or more bottom sublayers;
    one or more middle-layers between said top layer and said bottom layer;
    at least a first Nanoscale material path extending from a backside of said one or more solar cells, through said one or more top sublayers, through said one or more middle-layers, and to said one or more bottom sublayers, the first Nanoscale material path for directing thermal energy from at least one of the one or more solar cells or the battery;

at least a second Nanoscale material path extending from said one or more solar cells in said top layer, through said one or more middle-layers, to said battery in said bottom layer; and one or more electronic circuits adapted to control electrical charge along the second Nanoscale material path.

2. The device of claim 1 wherein said first Nanoscale material path is made of at least one of Nanotubes or Nanowires.

3. The device of claim 1 wherein said second Nanoscale material path is made of at least one of Nanotubes or Nanowires.

4. The device of claim 1 wherein said one or more bottom sublayers further comprise another Nanoscale material path which directs thermal energy from said battery to an external heat sink.

5. The device of claim 1 wherein said one or more middle-layers comprises a plurality of layers, and said first Nanoscale material path directs thermal energy from a first area to a distinct second area in said middle-layer.

6. The device of claim 1 wherein said first Nanoscale material path directs thermal energy to said second bottom volume of said bottom layer.

7. The device of claim 1 wherein said battery is less than three millimeters in at least one direction along said battery.

8. The device of claim 1 wherein said one or more top sublayers further comprises another Nanoscale material path electrically coupling said one or more solar cells to a power bus.

9. The device of claim 1 wherein said second Nanoscale material path comprises electrically conductive Nanoscale material which form one or more electrical paths between said top layer, said one or more middle layers, and said bottom layer.

10. The device of claim 1 wherein said first Nanoscale material path is a separate, distinct path than said second Nanoscale material path.

11. The device of claim 1 wherein said one or more bottom sublayers further comprise another Nanoscale material path electrically couples said battery to an electronic device.

12. An integrated solar cell and battery device, the device comprising:
   an outer portion having one or more solar cell;
   an inner portion integrally attached with the outer portion, the inner portion comprising a battery and a thermal path integrally embedded in a bottom battery layer within the inner portion;
   a first Nanoscale material thermally conductive path extending from the one or more solar cell of the outer portion to the inner portion, the first Nanoscale material thermally conductive path for directing thermal energy from at least one of the one or more solar cell or the battery; and
   a second Nanoscale material electrically conductive path extending from the one or more solar cell of the outer portion to said battery in said inner portion, the second Nanoscale material electrically conductive path for directing electrical charge.

13. The device of claim 12 wherein said outer and inner portions each comprise a generally flat layer, and wherein the layers are positioned in a generally parallel arrangement.

14. The device of claim 13 further comprising one or more middle layer positioned between the outer layer and the inner layer, the first Nanoscale material thermally conductive path and the second Nanoscale material electrically conductive path each extending through the middle layer.

15. The device of claim 14 wherein the outer layer further comprises one or more outer sublayers and the inner layer further comprises one or more inner sublayers.

16. The device of claim 12 wherein said first Nanoscale material thermally conductive path is a separate, distinct path than said second Nanoscale material electrically conductive path.

17. The device of claim 12 wherein said first Nanoscale material thermally conductive path is made of at least one of Nanotubes or Nanowires.

18. The device of claim 12 wherein said second Nanoscale material electrically conductive path is made of at least one of Nanotubes or Nanowires.

19. The device of claim 12 wherein said outer portion further comprises another Nanoscale material electrically conductive path electrically coupling said one or more solar cell to a power bus.

20. The device of claim 12 wherein said inner portion further comprises another Nanoscale material electrically conductive path which electrically couple said battery to an electronic device.

21. The device of claim 12 wherein said inner portion comprises another Nanoscale material thermally conductive path which directs thermal energy from said battery to an external heat sink.

* * * * *